United States Patent [19]
Le Person et al.

[11] Patent Number: 5,703,379
[45] Date of Patent: Dec. 30, 1997

[54] LIGHT-CONTROLLED SEMICONDUCTOR HETEROSTRUCTURE COMPONENT FOR GENERATING OSCILLATION AT MICROWAVE FREQUENCIES

[75] Inventors: Henri Le Person, Arcueil; Christophe Minot, Paris; Jean-François Palmier, Fontenay Aux Roses, all of France

[73] Assignee: France Telecom, France

[21] Appl. No.: 429,835

[22] Filed: Apr. 27, 1995

[30] Foreign Application Priority Data

Apr. 28, 1994 [FR] France ................... 94 05157

[51] Int. Cl.[6] .............. H01L 29/205; H01L 31/107; H01L 27/26
[52] U.S. Cl. .................... 257/21; 257/23; 257/25; 257/184; 257/191; 257/199
[58] Field of Search .................. 257/21, 184, 191, 257/199, 23, 25

[56] References Cited

U.S. PATENT DOCUMENTS

| | | | |
|---|---|---|---|
| 4,684,969 | 8/1987 | Taguchi | 257/21 |
| 5,034,783 | 7/1991 | Chang et al. | 257/191 |
| 5,285,080 | 2/1994 | Abe et al. | 257/23 |
| 5,446,293 | 8/1995 | Chu | 257/25 |

FOREIGN PATENT DOCUMENTS

| | | | |
|---|---|---|---|
| A-1 521 132 | 4/1967 | France. | |
| 5-41534 | 2/1993 | Japan | 257/25 |

OTHER PUBLICATIONS

Applied Physics Letters, vol. 38, No. 4, Feb. 15, 1981.
Journal of Lightwave Technology, vol. Lt-5, No. 3, Mar. 1987.
IEEE Transactions on Microwave Theory and Techniques, vol. MTT-35, No. 12.
Applied Physics Letters, vol. 25, No. 9, Nov. 1, 1974, pp. 493-496.
GEC Journal of Research, vol. 4, No. 3, 1986, pp. 194-202.
Patent Abstracts of Japan, vol. 9, No. 10 (E-290) (1733) Jan. 17, 1985.

Primary Examiner—Jerome Jackson
Attorney, Agent, or Firm—Blakely Sokoloff Taylor & Zafman

[57] ABSTRACT

The present invention relates to a light-controlled semiconductor heterostructure component for generating microwave frequency oscillations, wherein the heterostructure comprises at least two semiconductor materials: at least one of them absorbing light by creating electron-hole pairs; and the other one of them having majority carriers with a relationship of velocity as a function of electric field that presents a region of negative slope.

3 Claims, 2 Drawing Sheets

FIG_2
□ f = 21,4 GHZ
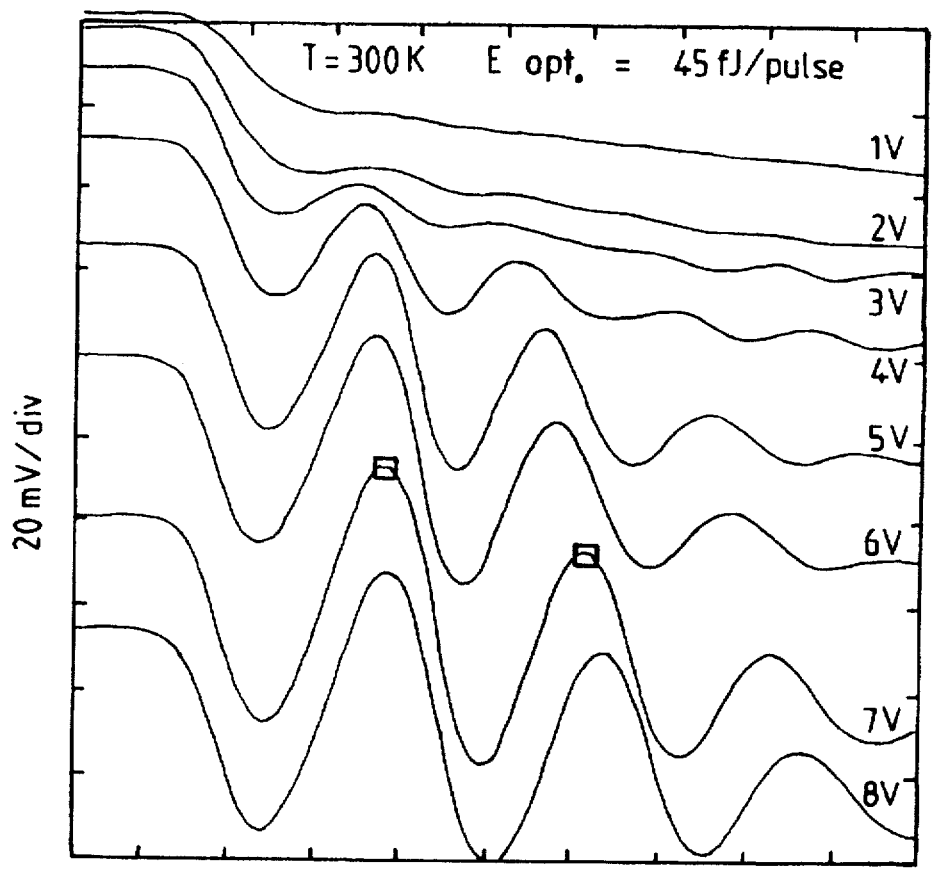
FIG_3
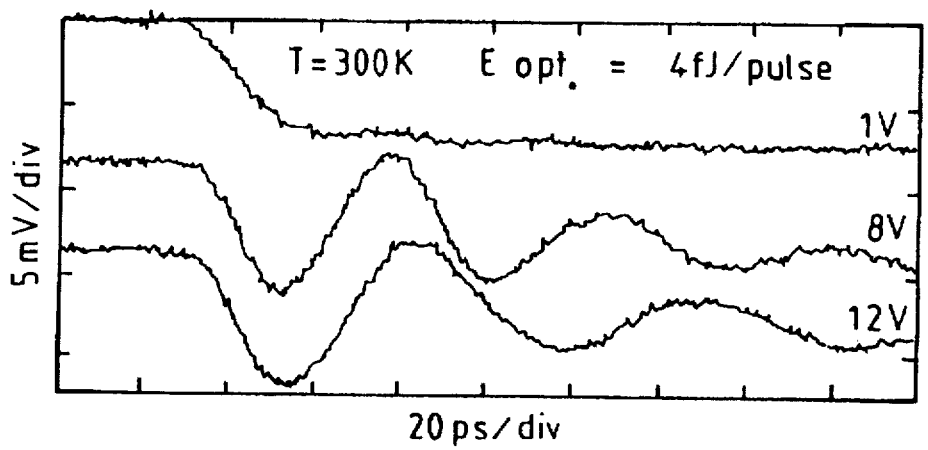

LIGHT-CONTROLLED SEMICONDUCTOR HETEROSTRUCTURE COMPONENT FOR GENERATING OSCILLATION AT MICROWAVE FREQUENCIES

FIELD OF THE INVENTION

The present invention relates to the field of light-controlled semiconductor heterostructure components for generating oscillation at microwave frequencies.

The present invention is particularly, but not exclusively, applicable to making active components for converting optical frequencies into microwave frequencies, optically controlled microwave generators, ultrafast detectors of weak optical signals, and wave train generators, in particular for radars, antenna arrays, and scanning antennas.

BACKGROUND OF THE INVENTION

Various structures have already been proposed for optically controlled semiconductor components, and in particular: 1) charge transfer or Gunn effect diodes generally referred to as transferred-electron devices (TED); 2) impact ionization avalanche transit time (IMPATT) diodes; 3) field-effect transistors (FETs); and 4) high electron mobility transistors (HEMTs).

For optically controlled charge transfer or Gunn effect diodes, reference may be made, for example, to the publication by T. F. Carruthers, J. F. Weller, H. F. Taylor, and T. G. Mills, in Applied Physics Letters 38 (4), Feb. 15, 1981, pp. 202–204, under the title: "Oscillation burst generation in transferred-electron devices with picosecond optical pulses".

For IMPATT diodes, reference may be made, for example, to the publication by A. J. Seeds, J. F. Singleton, S. P. Brunt, and J. R. Forest, in Journal of Lightwave Technology, Vol. LT-5, pp. 403–411, 1987, under the title: "The optical control of IMPATT oscillators".

For field-effect transistors and for high electron mobility transistors, reference may be made, for example, to the publication by R. N. Simons, in IEEE Transactions on Microwave Theory and Techniques, Vol. MTT-35, pp. 1444–1455, December 1987, under the title: "Microwave performance of an optically controlled AlGaAs/GaAs high electronic mobility transistor and GaAs MESFET".

The structures mentioned above have already given appreciable results.

Nevertheless, those known structures do not give full satisfaction.

In particular, it may be observed that those known structures:

have low sensitivity or require complex technology;

present non-negligible dark current; and do not make it possible to optimize the absorption coefficient of the material as a function of the exciting wavelength.

OBJECTS AND SUMMARY OF THE INVENTION

The present invention now has the object of improving light-controlled semiconductor heterostructure components for generating microwave frequency oscillation.

More particularly, the main objects of the present invention are the following:

adjusting the spectrum domain of sensitivity to that of optical excitation, particularly at the wavelengths of 1.3 microns and of 1.5 microns as are generally used for optical communications;

increasing the sensitivity of the optically controlled component and obtaining good efficiency;

increasing the maximum frequency that can be generated; and simplifying the optically controlled oscillator function and making it suitable for integration with the electronic and optoelectronic components that are used in telecommunications.

The present invention achieves these objects by providing a light-controlled semiconductor heretostructure component for generating microwave frequency oscillations, wherein the heterostructure comprises at least two semiconductor materials: at least one of them absorbing light by creating electron-hole pairs; and the other one of them having majority carriers with a relationship of velocity as a function of electric field that presents a region of negative slope.

As explained below, by dissociating the light-absorbing function from the oscillator function as defined in the present invention, it is possible to improve the performance of light-controlled semiconductor components for generating microwave frequency oscillation.

BRIEF DESCRIPTION OF THE DRAWING

Other characteristics, objects, and advantages of the present invention appear on reading the following detailed description made with reference to the accompanying drawings that are given by way of non-limiting example, and in which:

FIGS. 2 and 3 show the responses obtained on a structure of the present invention respectively for two different levels of applied optical energy.

MORE DETAILED DESCRIPTION

Figure 1:
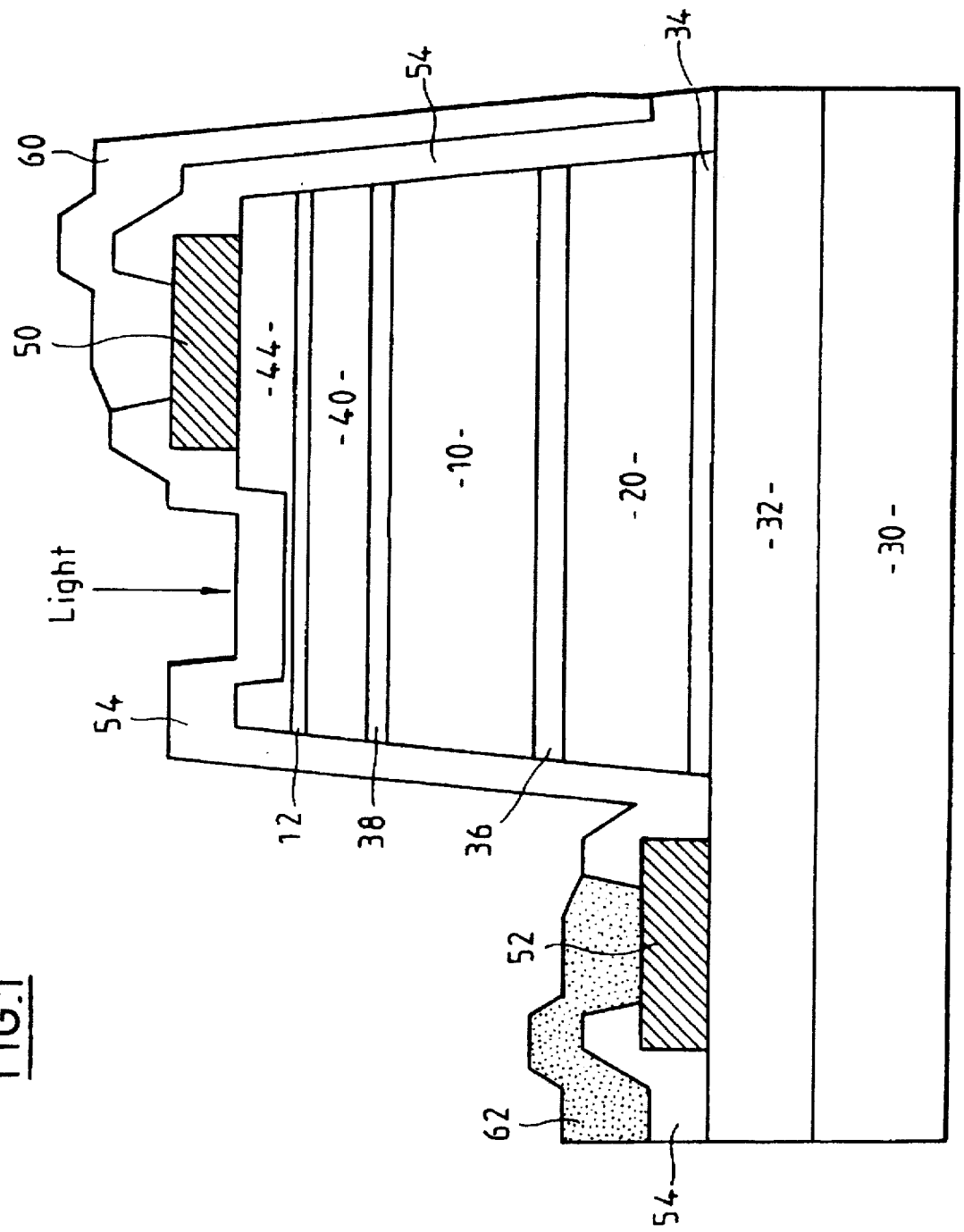
FIG. 1 is a section view through a structure for a component of the present invention.

As mentioned above, a component of the present invention comprises a heterostructure formed by at least two semiconductor materials 10 and 20.

The first material 10 serves at least to absorb light. It also constitutes a rapid transit zone for the photocreated minority carriers which induce a high current of majority carriers coming from the cathode.

For the majority carriers, the second material 20 possesses a relationship of velocity as a function of electrical field that presents a region of negative slope (negative differential velocity). This second material 20 is preferably also selected so that the minority carriers travel therein more slowly than in the first material 10 or so that the heterojunction (between the materials 10 and 20) is a blocking unction for the minority carriers.

The heterojunction also acts as a zone for accumulating minority charge which has the effect of increasing the amplitude of oscillation, and of increasing gain.

In a preferred embodiment which is described in detail below, the first material 10 is constituted by a solid layer of GaAs, while the second material 20 is constituted by a GaAs/AlAs superlattice.

It is known that a superlattice is constituted by a succession of potential wells separated by very fine barriers and coupled together by the resonant tunnel effect. Superlattices have already given rise to abundant literature.

The use of a GaAs semiconductor to form the first material 10 makes it possible to obtain a structure that is absorbent in the visible to near infrared region, i.e. from 0.4 µm to 0.85 µm. However, the present invention is not limited to using this particular material as the first material 10. The invention extends to other materials, including superlattices, and having a different spectral absorption range, and in particular 1.3 µm to 1.5 µm. Thus, by way of non-limiting example, for applications using the optical wavelength range of 1.3 µm to 1.55 µm, it is possible to use the following materials as the optically absorbent material of the layer 10:

a) solid materials such as $In_{0.53}Ga_{0.47}As$, or more generally $In_xGa_{1-x}A_yP_{1-y}$ with x=0.47y and $0.737 \leq y \leq 1$, thus constraining x to take up values lying in the range 0.346 to 0.47 (InGaAs), with the InGaAsP gap values then lying in the range 0.86 eV ($\lambda$=1.55 µm) and 0.724 eV (gap value for InGaAs). It is also possible to use $Al_xGa_yIn_{1-x-y}As$ with $0 \leq x \leq 0.165$ and $0.468 \geq y \geq 0.306$; and b) superlattices of ternary materials such as GaInAs/AlInAs or quaternary materials such as GaInAsP/AlGaInAs.

All of the above-specified materials are suitable for growing on InP: that means that the epitaxially grown material (InGaAs, InAlAs, etc. . . . ) and the substrate (InP) have matching lattice constants.

Nevertheless, materials that do not have matching lattice constants (pseudo-morphic: stressed materials) may also be used.

The above list is not exhaustive, it is possible in the invention to use other compounds made from III–V materials such as InSb, GaSb, etc. . . . or from II–VI materials, or even from superlattices made from SiGe/Si.

By using a superlattice to form the second material 20, it is possible to obtain a velocity relationship for electrons that has a negative slope over a large range of values of the applied electric field. The existence of this velocity relationship for the majority carriers makes it possible to generate current oscillations and thus to form domains of majority carriers transiting through the structure in a manner similar to the Gunn effect without it being necessary to use a resonant circuit as in IMPATT diodes.

Furthermore, choosing a second material 20 in such a manner that the minority carriers are slower therein than in the first material 10 contributes to lengthening the duration of the train of oscillations.

The present invention is not limited to a GaAs/AlAs superlattice for forming the second material 20, and any semiconductor can be used that has negative differential velocity, including solid materials.

For example, with an absorbent layer 10 constituted by a GaInAs/AlInAs or a GaInAsP/AlGaInAs superlattice, the layer 20 may be constituted by a GaInAs/AlInAs or a GaInAsP/AlGaInAs superlattice, with the entire assembly satisfying the heterostructure condition (appropriate choices of the various carrier velocity relationships).

Materials containing In (indium) and P (phosphorus) are grown epitaxially on InP and not on GaAs.

If the absorbent layer 10 is of GaAs, the other layer 20 is therefore preferably of GaAlAs, AlAs, or a superlattice of GaAs/AlAs or of GaAs/GaAlAs. The substrate (the material on which growth is performed) is then made of GaAs.

For telecommunications applications, an InP substrate is generally used, with the material 10 then advantageously being of InGaAs and the second material 20 then being constituted either by a solid material or else by a superlattice (InGaAs/InAlAs or InGaAsP/InAlAsP).

Naturally, the materials 10 and 20 must be selected to satisfy the heterostructure condition, i.e. the materials must have different forbidden band gaps unless they are separated by a third material or stack of materials, enabling said condition to be satisfied.

The basic structure of the present invention comprising the two above-mentioned materials 10 and 20 makes it possible to associate a "trigger" first material 10 in which the carriers are fast, i.e. in which transport effects are not very limiting on frequency, with a second material 20 (e.g. formed by a superlattice) offering a wide range of velocity relationships.

The advantage of such a structure is to have a medium with negative differential velocity that is thin, and is therefore capable of operating at high frequencies, and that is controlled via a mechanism of minority carrier generation and accumulation that is fast. It should be observed that in such an association, the effective parasitic capacitance is that of the two materials 10 and 20 connected in series.

In addition, as mentioned above, the persistence of oscillations is also due to the fact that an accumulation layer of minority carriers is created at the heterojunction because of the velocity difference of the carriers in the two materials.

Superlattices offer various advantages over other materials that are bulk materials but that also exhibit negative differential velocity. Firstly, because of their double periodicity and because of the existence of minibands, such superlattices offer a very wide range of velocity relationships depending on electric field, and this applies both to holes and to electrons which require a relationship of velocity as a function of electric field that has a negative slope. It should be recalled that holes control the duration of the train of oscillations. In addition, superlattices offer the possibility of adapting the value of the forbidden band gap by acting on superlattice parameters: well; barrier; and consequently absorbent coefficients at a given wavelength; and also, to some extent, the type of heterojunction.

A particular, non-limiting embodiment of the present invention is described below.

As can be seen in FIG. 1, this particular embodiment is obtained by using gas epitaxy on a semi-insulating GaAs substrate 30 to grow the various layers listed below (and in the order given):

a doped 0.84 µm thick GaAs layer 32 for making electrical contact;

a doped graded layer 34 which, like all graded layers, is constituted by a GaAs/AlAs superlattice of varying period;

a non-doped GaAs/AlAs superlattice having 53 periods of 14 monolayers of GaAs and of 6 monolayers of AlAs, constituting the second material 20;

a non-doped graded layer 36;

a non-doped 0.9 µm thick solid layer of GaAs which constitutes the first material 10;

a doped graded layer 38;

a doped "window" layer 40 that is transparent at the exciting wavelength, and constituted by 100 periods of a GaAs/AlAs superlattice, each period comprising 3 monolayers of GaAs and 4 monolayers of AlAs;

a doped graded layer 42; and finally a 0.2 µm thick doped GaAs layer 44.

The thicknesses of the above-listed layers are given by way of example in a specific embodiment and they are not critical.

The top layer 44 serves in comparable manner to the bottom layer 32 for making electrical contact.

All of the doped layers are of silicon donor n-type and the doping is sufficient for the values of access resistances to be negligible. For GaAs, the doping is greater than $3 \times 10^{18}$ $cm^{-3}$.

After being grown, the layers 44, 42, 40, 38, 10, 36, 20, and 34 of the resulting structure are etched as a slab or a ridge to reveal the layer 32, as can be seen in FIG. 1.

Ohmic contacts 50 and 52 are deposited respectively on the top layer 44 of the structure and on the revealed base layer 32.

An insulating layer 54 is then deposited over the entire component. The insulation 54 must be optically transparent at the working wavelength. The insulation 54 used is advantageously silica, since silica does not induce any stress in the materials on which it is deposited. In addition, its thickness can be adjusted so that it also constitutes an antireflection layer at the exciting optical wavelength. However, as can be seen in FIG. 1, before depositing the insulating layer 54, the top layer 44 is locally etched through a fraction of its thickness where it is to receive the excitation light, thereby allowing said top layer 44 to pass the light to the absorbent layer 10.

Finally, passages are opened through the insulating layer 54 vertically over the ohmic contacts 50 and 52 so as to enable electrical connections to be made with the ohmic contacts 50 and 52 by metallization 60 and 62, e.g. based on gold.

With the structure as described above, the positive bias terminal should be connected to the metallization 60.

The window-forming layer 40 is not absolutely essential, but it nevertheless serves to ensure good distribution of potential over the surface of the absorbent layer 10 in spite of the localization of the ohmic contact 50.

The structure obtained in this way makes it possible, under optical excitation and with the structure being biased by means of the metallization 60, 62, to obtain oscillations having center frequencies lying in the range 28 GHz to 18 GHz for bias voltages running from 4 volts to 8 volts, respectively. A train of oscillations lasts for longer than 200 ps. The controlling optical energy is about 45 femto-Joules (fJ) per pulse.

More precisely, FIG. 2 shows the response of the structure to control energy of 45 fJ per pulse, whereas FIG. 3 shows the response of the structure to control energy of only 4 fJ per pulse. It should be observed that in FIGS. 2 and 3, the various response curves corresponding to different bias voltages have been offset so as to make the figures easier to read; in practice, all of the curves shown correspond to very low values of dark current.

In practice, it is possible to make numerous components of the present invention simultaneously on a common wafer. After each component has been individualized, it is fixed and connected to a microstrip line having a passband that is greater than the desired operating frequency. A hybrid component is thus obtained.

However, at very high frequencies (greater than 50 GHz) it may be advantageous for the assembly (component plus microstrip lines) to be integrated in a single technological process.

The structure of the component can be designed to present a specific operating frequency by defining said structure with the help of digital simulation of the operation of the component, or in a variant, and highly approximately, by determining the ratio of the half-value of the maximum velocity of electrons in the second material 20 at an optimum bias voltage, e.g. about 8 volts, to the thickness of said second material 20. The above-mentioned digital simulation makes use essentially of the velocity relationships of the carriers in the materials under consideration.

Naturally, the present invention is not limited to the particular embodiment described above, but it extends to any variants within the spirit of the invention.

For example, to increase the efficiency of conversion from light to microwaves, and the duration of oscillation, it is possible to dope the superlattice 20 and the optically absorbent layer 10 made of GaAs with donors to a concentration of about $2 \times 10^{16}$ cm$^{-3}$.

Furthermore, in the context of the present invention, it is also possible to use structures that are simplified with respect to growth, in particular by omitting at least some of the graded layers formed by the layers 34, 36, 38, and 42, without excessively degrading efficiency, and/or by reversing the order in which the superlattice 20 and the absorbent layer 10 are grown. When the layers are grown in the reverse order, the absorbent layer 10 is deposited before the superlattice 20. In addition, under such circumstances, it is possible to omit the window layer 20, but it is necessary to determine the optical properties of the various layers. Naturally the superlattice 20 must then be optically transparent, at least at the working wavelength, such that the excitation light is capable of reaching the absorbent layer 10. It is also necessary under such circumstances to reverse the polarity of the electrical bias applied between the terminals 60 and 62.

In conclusion, the present invention makes it possible to provide an optically-controlled generator of trains of oscillations of large amplitude at a center frequency that is variable (in the range 15 GHz to 40 GHz) as a function of the bias voltage applied between the areas of metallization 60 and 62 (positive bias on the contact 60). Microwave generation is triggered by a low energy laser pulse (energy may be as little as 4 fJ, for example).

By dissociating the light-absorbtion and oscillator functions, it is possible both to improve efficiency and to select the desired frequency of oscillation.

Furthermore, digital simulations have shown that it is possible with a structure of the present invention to obtain oscillations with very high efficiency (comparable to the best existing components) at frequencies that are well above 40 GHz, e.g. several hundreds of GHz, and for periods of several nanoseconds.

In another variant, it is possible to place the ohmic contact 52 on the surface of the substrate 30 opposite from the superlattice 20. Under such circumstances, the substrate 20 must be doped and may directly constitute the layer 32.

By way of non-limiting example, reference may be made to the following publications which mention velocity relationships for carriers (electrons), both in solid materials such as GaAs, InGaAs, etc. . . . , and in superlattice structures.

a) For solid materials:

GaAs:

B. K. Ridley and T. B. Watkins. Proc. Phys. Soc. London 78, 293 (1961).

B. K. Ridley. Proc. Phys. Soc. London 82, 954 (1963).

C. Hilsum. Proc. IRE 50, 185 (1962).

J. B. Gunn. Solid State Comm. 1, 88 (1963).

InP:

J. B. Gunn. Solid State Comm. 1, 88 (1963).

In$_{0.53}$Ga$_{0.47}$As:

M. A. Littlejohn, T. H. Glisson and J. R. Hauser. In "GaInAsP alloy semiconductor", Ed. T. P. Pearsall (John Wiley, 1982), Ch. 10, pp. 243–274.

In$_{0.52}$Al$_{0.48}$As:

H. S. Kim, H. Tian, K. W. Kim and M. A. Littlejohn. In Appl. Phys. Lett. (USA), Vol. 61 (1992), pp. 1202–1204.

b) For superlattices:

L. Esabki and R. Tsu. "Superlattice and negative conductivity in semiconductors", IBM Res. Note, RC-2418, March 1969.

A. Sibille, J. F. Palmier, H. Wang and F. Mollot. Phys. Rev. Lett., 64, 52 (1990).

H. Le Person, J. F. Palmier, C. Minor, J. C. Esnault and F. Mollot Surface Science, 228, 441 (1990).

C. Minot, H. Le Person, J. F. Palmier and F. Mollot. Phys. Rev. B47, 10024 (1993).

A. A. Ignatov, K. F. Renk and E. P. Dodin. Phys. Rev. Lett. 70, 1996 (1993).

H. T. Grahn, K. von Kiltzing, K. Ploog and G. H. Döhler. Phys. Rev. B43, 12094 (1991).

F. Beltram, F. Capasso, D. L. Sivco, A. K. Hutchinson, S.-N. G. Chu and A. Y. Cho. Phys. Rev. Lett. 64, 3167 (1990).

In another variant, the component may be made from a doped substrate and by depositing a doped layer that acts as a buffer (a layer of the same nature as the substrate but of very high crystal quality, thereby enabling the other layers to grow without stress), prior to depositing the layers 32 to 44 as described with reference to FIG. 1. Under such circumstances, contact is preferably made by depositing the ohmic contact 52 on the surface of the substrate that is opposite from the superlattice 20.

In the context of the present invention, any other component (transistor, . . . ) can also be integrated on the same substrate, e.g. for the purpose of decoupled control of the control voltage or for possible amplification.

We claim:

1. An optically controlled oscillator comprising the following layers successively epitaxially deposited on a semi-insulating substrate:

a doped layer serving to make electrical contact;

a doped graded layer;

a superlattice exhibiting for majority carriers a relationship of velocity as a function of electric field that presents a region of negative slope;

a non-doped graded layer;

a layer including light absorbing material for creating electron-hole pairs;

a doped graded layer;

a window-forming layer that is transparent at the exciting wavelength;

a doped graded layer; and a doped layer, so that said oscillator generates a train of microwave oscillations following reception on said light absorbing material of a low energy light pulse.

2. The oscillator of claim 1, wherein the substrate is doped and a doped layer is deposited on the substrate prior to depositing the above-specified layers.

3. An optically controlled oscillator comprising the following layers deposited epitaxially in succession on a semi-insulating GaAs substrate:

a doped GaAs layer for making electrical contact;

a doped graded layer which is constituted, as are all the graded layers, by a GaAs/AlAs superlattice of varying period;

a non-doped GaAs/AlAs superlattice comprising 53 periods of 14 GaAs monolayers, and of 6 AlAs monolayers exhibiting for majority carriers a relationship of velocity as a function of electric field that presents a region of negative slope;

a non-doped graded layer;

a non-doped GaAs solid layer including light absorbing material for creating electron-hole pairs;

a doped graded layer;

a doped window-forming layer that is transparent at the exciting wavelength and that is constituted by 100 periods of a GaAs/AlAs superlattice each having three GaAs monolayers and 4 AlAs monolayers;

a doped graded layer; and a doped GaAs layer, so that said oscillator generates a train of microwave oscillations following reception on said light absorbing material of a low energy light pulse.

* * * * *

UNITED STATES PATENT AND TRADEMARK OFFICE
CERTIFICATE OF CORRECTION

PATENT NO. : 5,703,379
DATED : December 30, 1997
INVENTOR(S) : Le Person et al.

It is certified that error appears in the above-identified patent and that said Letters Patent is hereby corrected as shown below:

In column 2, at line 53, please delete "unction" and insert --junction--.

In column 7, at line 22, please delete "prow" and insert --grow--.

Signed and Sealed this

Fifteenth Day of June, 1999

Attest:

Attesting Officer

Q. TODD DICKINSON

Acting Commissioner of Patents and Trademarks